US012650477B2

(12) United States Patent
Asiminoaei et al.

(10) Patent No.: US 12,650,477 B2
(45) Date of Patent: Jun. 9, 2026

(54) METHOD FOR EVALUATING THE DEGRADATION LEVEL OF CAPACITORS OF A POWER FILTER, ADJUSTABLE SPEED DRIVE AND POWER CONVERTER PROVIDED FOR PERFORMING THE METHOD

(71) Applicant: Danfoss Power Electronics A/S, Gråsten (DK)

(72) Inventors: Lucian Asiminoaei, Alnor (DK); Luzia Almeida, Nordborg (DK); Jörg Dannehl, Soerup (DE); Sanjeet Kumar Dwivedi, Gråsten (DK); Norbert Hanigovszki, Sønderborg (DK)

(73) Assignee: DANFOSS POWER ELECTRONICS A/S, Gråsten (DK)

( * ) Notice: Subject to any disclaimer, the term of this patent is extended or adjusted under 35 U.S.C. 154(b) by 615 days.

(21) Appl. No.: 18/067,862

(22) Filed: Dec. 19, 2022

(65) Prior Publication Data

US 2023/0194630 A1 Jun. 22, 2023

(30) Foreign Application Priority Data

Dec. 20, 2021 (DE) .......................... 102021133889.1

(51) Int. Cl.
*G01R 31/64* (2020.01)
*G01R 23/15* (2006.01)
*H03H 7/01* (2006.01)

(52) U.S. Cl.
CPC ............. *G01R 31/64* (2020.01); *G01R 23/15* (2013.01); *H03H 7/0115* (2013.01)

(58) Field of Classification Search
CPC ........ G01R 31/64; G01R 23/15; G01R 23/02; G01R 31/00; H03H 7/0115; H02P 23/00
See application file for complete search history.

(56) References Cited

U.S. PATENT DOCUMENTS

| | | | |
|---|---|---|---|
| 6,225,710 B1 | 5/2001 | Palata et al. | |
| 2013/0057297 A1* | 3/2013 | Cheng | .................. H02M 7/539 |
| | | | 324/548 |

FOREIGN PATENT DOCUMENTS

| | | | |
|---|---|---|---|
| CN | 104515917 A | 4/2015 | |
| CN | 111279599 A * | 6/2020 | .......... H02M 3/1582 |
| CN | 112154332 A | 12/2020 | |
| DE | 10 2008 023 837 A1 | 1/2009 | |
| EP | 2 963 796 B1 | 5/2017 | |
| EP | 2791743 B1 * | 5/2018 | ............. G01R 31/42 |
| JP | 2005337986 A | 12/2005 | |
| JP | 2009-177677 A | 8/2009 | |

* cited by examiner

*Primary Examiner* — Catherine T. Rastovski
*Assistant Examiner* — Emma Alexander
(74) *Attorney, Agent, or Firm* — McCormick, Paulding & Huber PLLC

(57) ABSTRACT

The present invention is directed at a method for evaluating the degradation level of capacitors of a power filter connected to an adjustable speed drive (ASD) or a power converter. The invention is also directed at an adjustable speed drive and a power converter provided for performing the method.

19 Claims, 13 Drawing Sheets

Fig. 7a
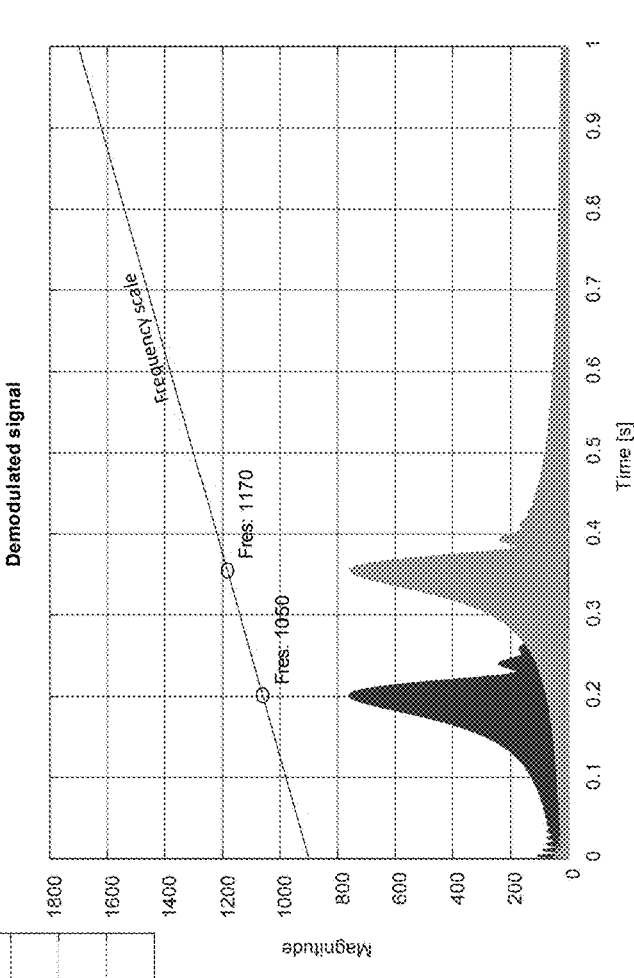
Fig. 7b

METHOD FOR EVALUATING THE DEGRADATION LEVEL OF CAPACITORS OF A POWER FILTER, ADJUSTABLE SPEED DRIVE AND POWER CONVERTER PROVIDED FOR PERFORMING THE METHOD

CROSS-REFERENCE TO RELATED APPLICATION

This application claims foreign priority benefits under 35 U.S.C. § 119 from German Patent Application No. 102021133889.1, filed Dec. 20, 2021, the content of which is hereby incorporated by reference in its entirety.

TECHNICAL FIELD

The present invention is directed at a method for evaluating the degradation level of capacitors of a power filter connected to an adjustable speed drive (ASD) or a power converter.

The invention is also directed at an adjustable speed drive and a power converter provided for performing the method.

BACKGROUND

The present invention relates generally to the field of adjustable speed drives and power converters and their use together with power filters. Power filters are essential components in drive systems, which neutralize the switching effect of the power devices of the inverter on the motor lifetime.

In known applications, an LC output filter is the passive component of a drive system. It is not always possible to disconnect it from the drive system to check its health. In certain critical applications it is not permissible to stop the drive and hence it is impossible to perform a health check of the energized LC filter.

Known solutions deal with the disconnection of the filter from the drive system. Depending on the size of the field of application of the present invention, there may be hundreds of drives utilizing LC filters, for example in petrochemical plants. Disconnecting these drives may result in a shut-down of considerable scale and associate high down-time costs. Therefore, it is not always possible to disconnect multiple drives for performing health checks on the filters and their capacitors.

SUMMARY

The aim of the invention is to provide an improved method for evaluating the degradation level of capacitors, an improved adjustable speed drive (ASD) and power converter, which overcome the above outlined problems.

This aim is achieved by a method according to claim 1, an adjustable speed drive (ASD) according to claim 13 and a power converter according to claim 14. Preferable embodiments of the invention are subject to the dependent claims.

According to claim 1, a method is provided for evaluating the degradation level of capacitors of a power filter connected to an adjustable speed drive (ASD) or a power converter. In a preferred embodiment of the invention, the method comprises the steps of:

injecting a controllable disturbance and measuring the response of at least one of the capacitors, determining the non-degraded resonance frequency of the capacitor, injecting a second controllable disturbance and measuring the response of the capacitor, determining the degraded resonance frequency of the capacitor, and determining the degradation level of the capacitor from the two resonance frequencies.

The capacitors may be part of the power filter and/or it may be connected to the system. In case of an input power filer, the system may comprise the power supply, power filter and power converter. In case of an output filter, the system may comprise the power converter/drive, the power filter and the motor. According to the invention, AC signals of preferably different frequencies may be injected into at least one of the capacitors for a limited time. This allows to sense and calculate the resonance frequency of the power filter, which relates to the state of the filter capacitor. Once the capacitor degrades over time, its resonance frequency shifts to higher frequencies. Deep degradation of capacitors may cause unpredictable events such as explosions or other equipment failure. The present invention detects the degree of change of the resonance frequency and estimates the amount of capacitor degradation based on the change of the resonance frequency. The present invention estimates the degradation level of the capacitors in the power filters, which may be used by predictive maintenance programs. The present invention uses the power converter itself as a sensor to detect the degradation of the capacitor.

The invention provides a method which does not require to switch off the drive to estimate the health status of the filter. By monitoring the degradation of the capacitor one can act in due time to avoid malfunction or destruction of the drive. Thus, it is possible to greatly improve the safety, reliability, and security of the drive. The present invention makes it possible to avoid equipment failure and unpredictable operation stops. Consequently, it is possible to achieve additional cost reductions.

In a preferred embodiment of the invention, the non-degraded resonance frequency is theoretically determined from equation 1:

$$f_{resBaseline} = \frac{1}{2\pi\sqrt{L_{ech}C_{fBaseline}}},$$

In another preferred embodiment of the invention, the degraded resonance frequency is theoretically determined from equation 2:

$$f_{resDegraded} = \frac{1}{2\pi\sqrt{L_{ech}C_{fDegraded}}}$$

The equivalent inductance $L_{ech}$ is the combined inductance of the entire system, i.e. of the motor inductance $L_{motor}$ and the filter inductance $L_{fi}$.

In another preferred embodiment of the invention, the degradation level of the capacitor is determined form Equation 4:

$$Degradation = 100\left(\frac{f_{resBaseline}}{f_{resDegraded}}\right)^2 [\%]$$

In another preferred embodiment of the invention, the method steps are repeated periodically, in particular based on a local timer value.

In another preferred embodiment of the invention, the timer value is a function of the operating time of the power converter or adjustable speed drive.

In another preferred embodiment of the invention, the determination of the non-degraded resonance frequency of the filter including the capacitor comprises a nameplate estimation, a standstill state measurement and/or a running state measurement.

In another preferred embodiment of the invention, the degraded resonance frequency of the capacitor comprises a standstill state measurement and/or a running state measurement.

In another preferred embodiment of the invention, the power filter comprises an input power filter and/or an output power filter. The power filter may therefore be connected either between grid and power converter or variable speed drive and motor.

In another preferred embodiment of the invention, software for operating the adjustable speed drive or the power converter is provided for measuring the resonance of the system comprising the filter capacitor by injecting the controllable disturbance and measuring the transfer function of the system comprising the filter capacitor.

In another preferred embodiment of the invention,
a frequency of injections is monotonically changed within a given range around the degraded and/or non-degraded resonance frequency,
and/or a frequency of injection is randomized to minimize disturbances,
and/or the injections omit critical frequency areas to avoid control issues,
and/or the magnitudes of injections are adjusted manually and/or automatically to minimize disturbances,
and/or the duration of injections are adjusted manually and/or automatically to minimize disturbances,
and/or the method steps are repeated at an automatically increasing frequency or repetition rate, when the capacitor degrades beyond a given level, in order to monitor its accelerated degradation.

The frequency of injection is randomized to minimize disturbances of the motor, disturbances of the entire application or general audio disturbances. The injections may omit critical frequency areas to avoid control issues such as aliasing, EMI interference, mechanical resonances and/or disturbances of the application. When the capacitor degrades beyond a given level, the repetition rate of the method may be increased in order to monitor accelerated capacitor degradation.

In another preferred embodiment of the invention, the lengths and/or the magnitudes of the injections are adapted to the speed and/or load of the running conditions of the adjustable speed drive or the power converter, and/or the method steps are repeated at a rate, which is adjusted manually and/or automatically.

Alternatively or additionally, the lengths and/or the magnitudes of the injections may be adapted to the speed and/or load of the running conditions of a device controlled by the ASD or a device connected to the power converter. The rate of repetition of method steps may be adjusted automatically such that enough measurements for an accurate estimation are generated.

In another preferred embodiment of the invention,
the degradation level is compared to thresholds to issue warnings, alarms and/or trip signals, and/or that degradation level is determined for each phase of a multiphase signal individually;
and/or a time-series of capacitor degradation is used to estimate the end-of-life moment for predictive/preventive maintenance,
and/or capacitor degradation is used for updating the control parameters of the adjustable speed drive or the power converter to improve the control performance,
and/or the determined resonant frequencies are used to omit operating conditions of the adjustable speed drive or the power converter that may excite said resonant frequencies.

As a consequence, it is possible to minimize the harmonic stress and consequently increase the lifetime of the power filter.

The invention is also directed at an adjustable speed drive for performing a method according to at least claim 13. The software of the adjustable speed drive is provided for measuring the resonance of the system comprising the capacitor by injecting the controllable disturbance and measuring the transfer function of the system comprising the capacitor.

The invention is furthermore directed at a power converter for performing a method according to at least claim 14. Its software is provided for measuring the resonance of the capacitor by injecting the controllable disturbance and measuring the transfer function of the system comprising the capacitor.

BRIEF DESCRIPTION OF THE DRAWINGS

Further advantages and details of the invention are described with reference to the figures. The figures show:
FIGS. 7a and 7b: effect of the capacitance drop seen in the Bode plot and detected by the signal injection method.

DETAILED DESCRIPTION

Figure 1:
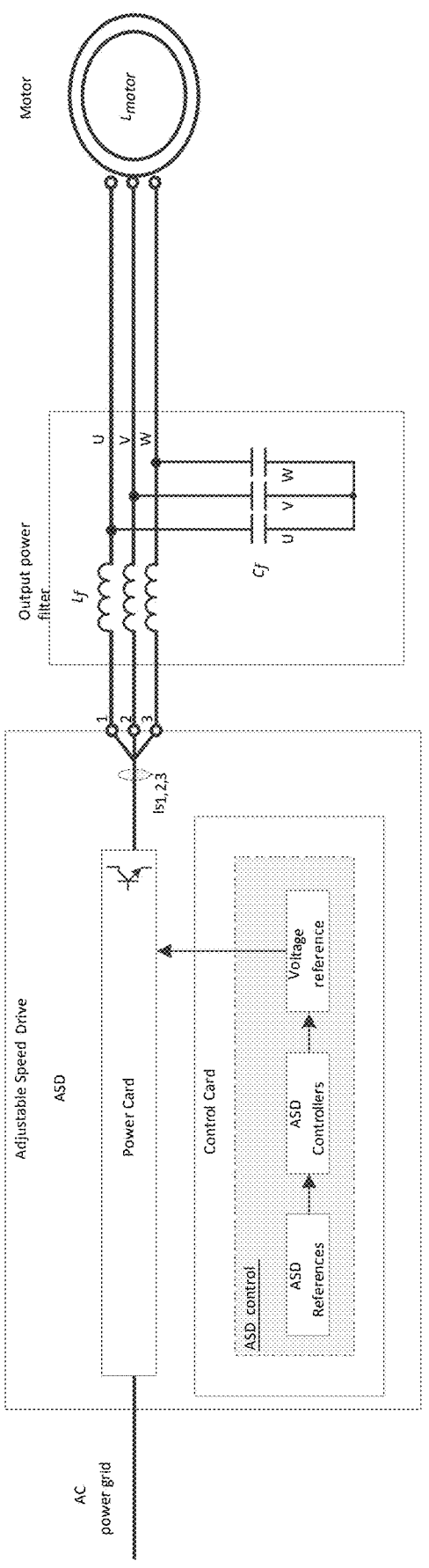
FIG. 1: a block diagram of the adjustable speed drive connected to an output power filter and a motor.

FIG. 1 shows a block diagram of an adjustable speed drive ASD according to the state of the art. The ASD is connected to an output power filter and a motor.

Adjustable speed drives are used together with motors to achieve controllable speed and power as is required for e.g. industrial applications. The ASD provides a pulse width modulation voltage at its output for this controllable motion of the motor.

A drawback of the modulation is the voltage stress on the motor windings. Therefore, output power filters Cf are used to smooth the stress caused by the high voltage modulation, thus providing a lower electrical stress to the motor isolation materials. Furthermore, the motor has lower losses and therefore yields lower temperatures, which is of interest for lowering the fire hazard.

FIG. 1 shows a typical connection of the output power filter in between the ASD and the motor. With increasing operation hours, the capacitors Cf are changing their physical properties, thereby undergoing a degradation process. Known sources of capacitor degradation are internal effects triggered by the current and voltage loading applied to the capacitor. Internal effects comprise temperature stresses, which accelerates the aging of the capacitor, in particular its internal structure and material properties. Internal effect also comprise the corona effect and voltage breakdown effects, which change the material structure and its overall properties.

Further sources of capacitor degradation are related to external effects, i.e. environmental conditions such as ambient temperature, ventilation, humidity and/or pressure. Other sources of capacitor degradation are time-dependent and related to the aging of materials inside the capacitor. Mechanical factors may also contribute to the capacitor degradation such as mounting conditions and external mechanical stresses, which change the capacitor structure and its physical properties.

Once the capacitor degrades there is a higher risk of malfunction and incorrect operation of the controlled motor.

The present invention provides a method and devices for estimating the degradation of the capacitor in power filters connected to the ASD. The invention uses the ASD directly to detect the degradation of the filter capacitor Cf.

The method injects an AC current of different frequencies for a limited period of time. This allows to sense and calculate the resonance frequency of the power filter, which depends on the filter capacitor Cf. Once the capacitance degrades over time, its resonance frequency shifts to higher frequencies and the presently described invention makes it possible to detect the degree of change and estimates the amount of capacitor Cf degradation.

The invention makes it possible to detect both, symmetrical and asymmetrical degradation of capacitors Cf in three-phase applications.

Figure 2:
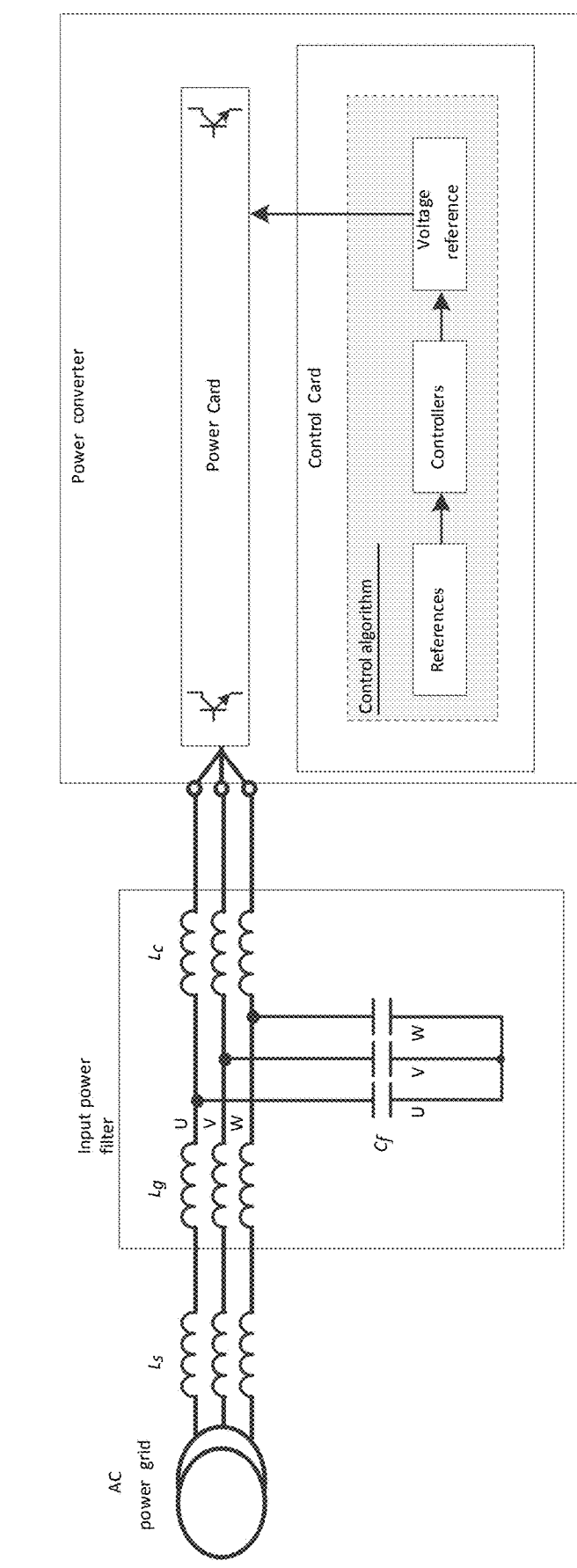
FIG. 2: a block diagram of a power converter connected to the AC supply through an LCL input power filter.

FIG. 2 shows a block diagram of a power converter connected to the AC supply through an LCL input power filter. It shows the typical use of an input power filter in an active-front-end power converter application. The power converter has controllable power switches on the grid-side, therefore an input filter is typically used to filter out the pulse width modulation noise. Examples of such applications are power generation units in photo voltaic applications and wind power generation, regenerative power converters used in power drives, etc. The capacitor Cf is exposed to the same kind of electrical stress due to the pulse width modulation and suffers a similar aging process as described above with reference to FIG. 1.

Figure 3:
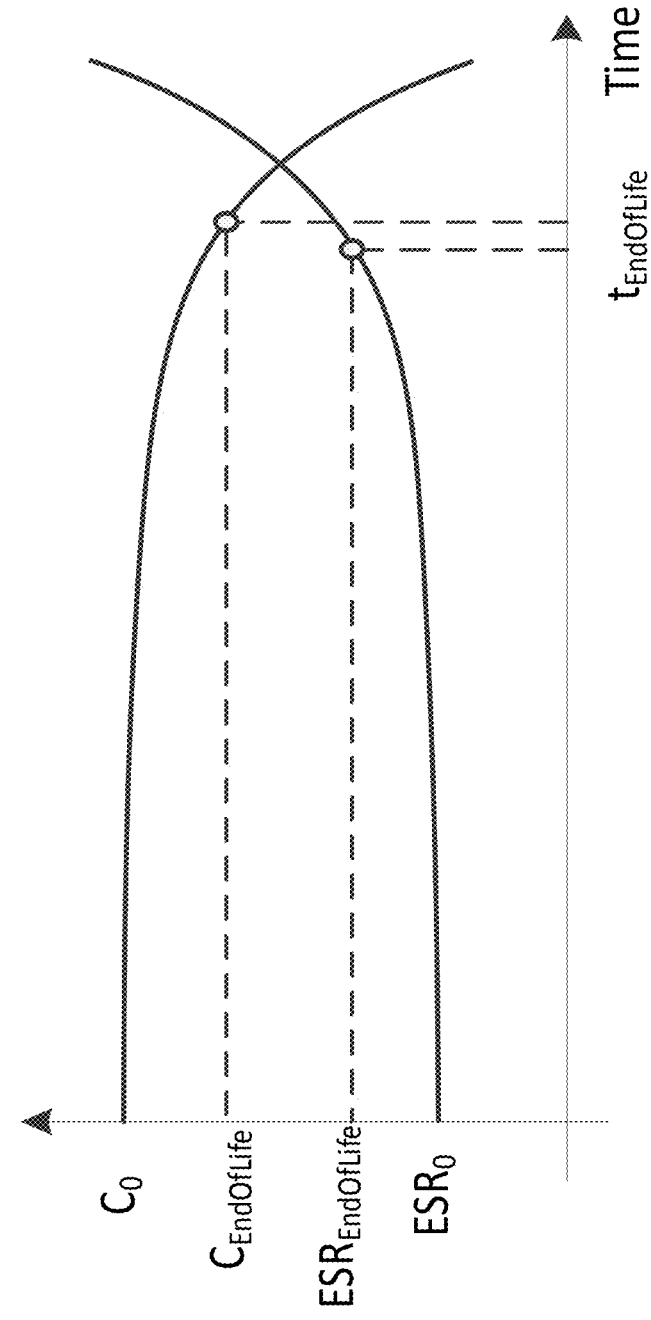
FIG. 3: an illustration of the capacitor degradation process in time, showing the evolution of the capacitance C and the ESR.

FIG. 3 is an illustration of the capacitor degradation process in time, showing the evolution of the capacitance C and the ESR. Both values, the healthy capacitor $C_0$ and end-of-life $C_{EOL}$ are indicated. The following methods are used for monitoring the capacitor degradation.

Temperature is a good indicator of the capacitor degradation if one can estimate the losses in the capacitor. Thus, one method is to compare the temperature for the same amount of losses. A higher temperature indicates a higher degradation of the capacitor for a given amount of electrical losses. The challenge is to estimate the losses, as this would require knowing the Equivalent Series Resistance (ESR), even though some simplifying assumptions can be made. A temperature sensor can directly be used for tripping logic in the drive.

The equivalent series resistance (ESR) of the capacitor is another known indicator of capacitor degradation. A corresponding method requires a suitable definition and characterization of what kind of ESR (loss factor) is considered, at what frequency and in which measurement conditions. Not having these specified beforehand and not having a good understanding of the dependencies may lead to errors in the estimation, since other influences such as temperature, humidity, etc. may appear during evaluation. One limitation is the need for sensors for both, the voltage and the current in the capacitor.

The loss of capacitance is another way to predict the capacitor degradation. The loss of capacitance is not a risk in itself, but it is linked to internal changes in the capacitor and therefore related to the capacitor degradation. A reduction in capacitance presents a collateral risk: as the LC resonance frequency increases towards switching frequency, it determines an increase of the internal losses.

Other two less common possibilities to monitor the capacitor degradation are by monitoring the isolation resistance and the thermal impedance. Such methods are not commonly used in practice, due to the need for advanced measuring equipment.

The present invention may be carried out with a drive, an output power filter and a motor. The admittance of the corresponding system is derived by analytical calculation and plotted as a frequency response transfer function as shown in FIG. 3. If a voltage $u_{ASD}$ is present at the ASD terminal, the current is shown at different frequencies. This approach is useful to get a basic understanding of the sensitivity regions as a function of frequency, and hence where to expect a strong signature of the capacitor.

The following transfer functions are calculated:

| | | |
|---|---|---|
| $Y_{ASD}(s) = i_{ASD}/u_{ASD}$ | =drive current | based on drive voltage |
| $Y_{cap}(s) = i_j/u_{ASD}$ | =capacitor current | based on drive voltage |
| $Y_{moto}(s) = i_s/u_{ASD}$ | =motor current | based on drive voltage |

Figure 4:
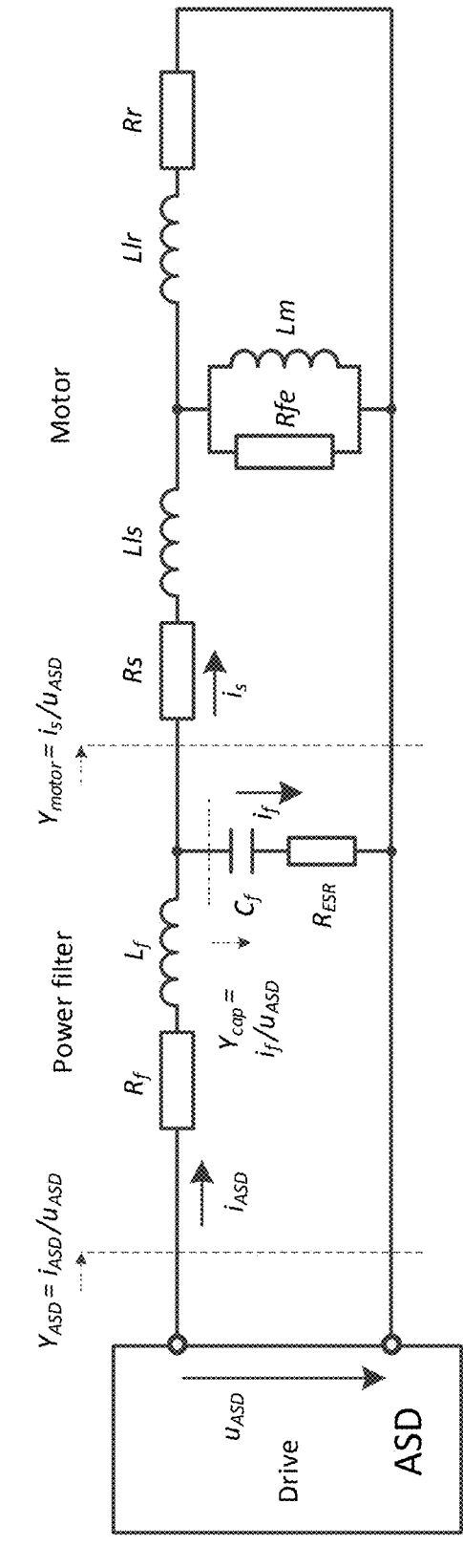
FIG. 4: an electrical drawing showing the transfer functions of the system.

FIG. 4 shows an equivalent circuit with the transfer functions of the system.

Figures 5A, 5B, 5C:
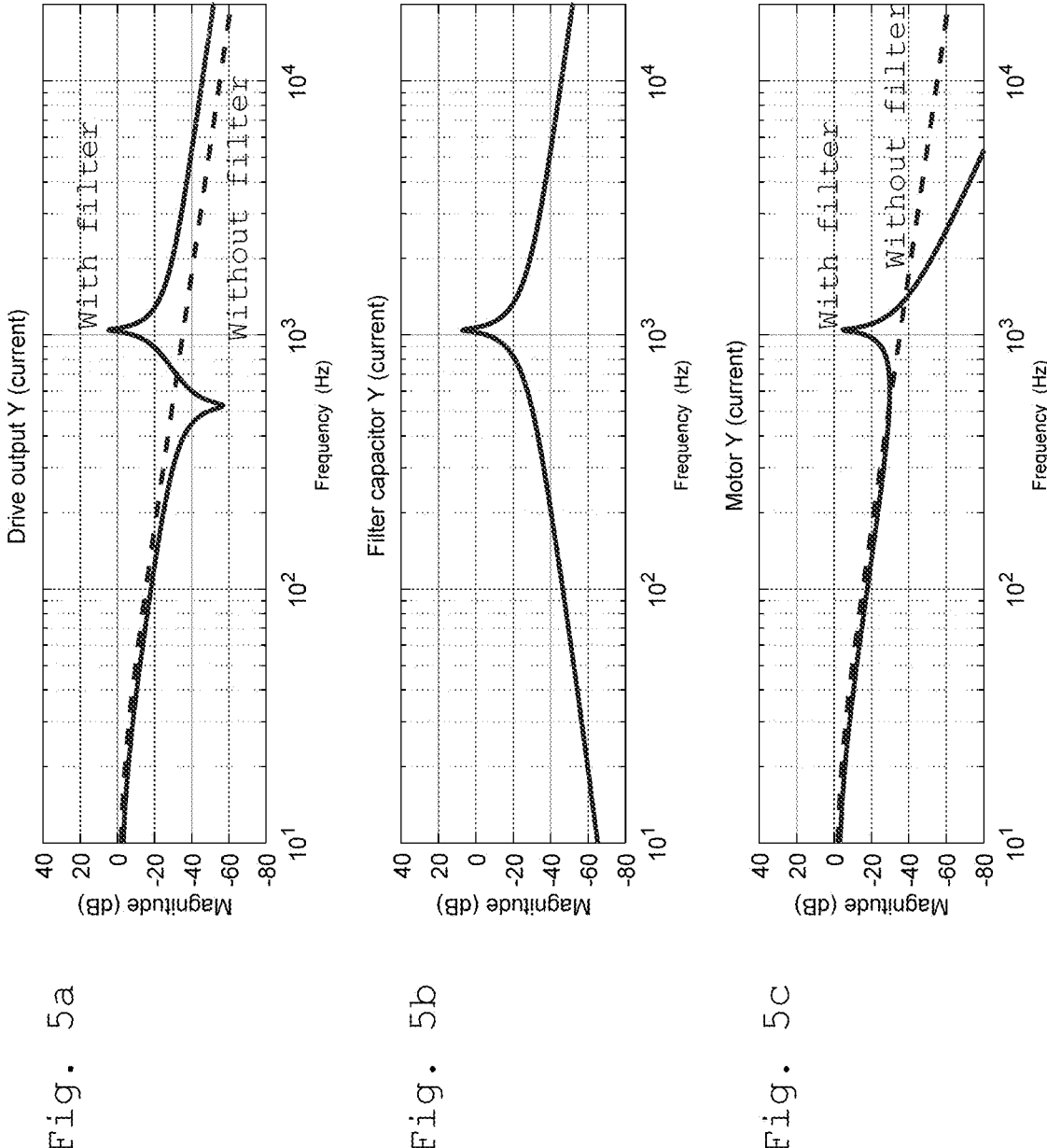
FIGS. 5a-5c: transfer functions of the system admittance Y (alias current)

FIGS. 5a to 5c show the Bode plots of the transfer functions of the filter and a motor Both cases with (solid line) and without (dashed line) the output power filter are plotted to see its effect on the transfer function. FIG. 5a shows the Bode plot for a combination of the filter with the motor. FIG. 5b shows the Bode plot only for the filter and FIG. 5c shows the Bode plot only for the motor.

The signature of the capacitance seen in the current is based on the following equation:

$$i_{ASD} = Y_{ASD}(s)*U_{ASD}$$

For a strong signature of the capacitor in the drive current, a high factor is desired, i.e. either a high voltage $u_{ASD}$ and/or a high admittance $Y_{ASD}(s)$.

The resonance frequency provides a strong indication of the degradation of the filter capacitance. In order to get this information, the LC resonance has to be excited first with an injected voltage signal produced by the ASD. The change in resonance frequency is measured via the drive's output-current sensors. This deviation in resonance frequency is associated with the change in capacitance value.

Figure 6:
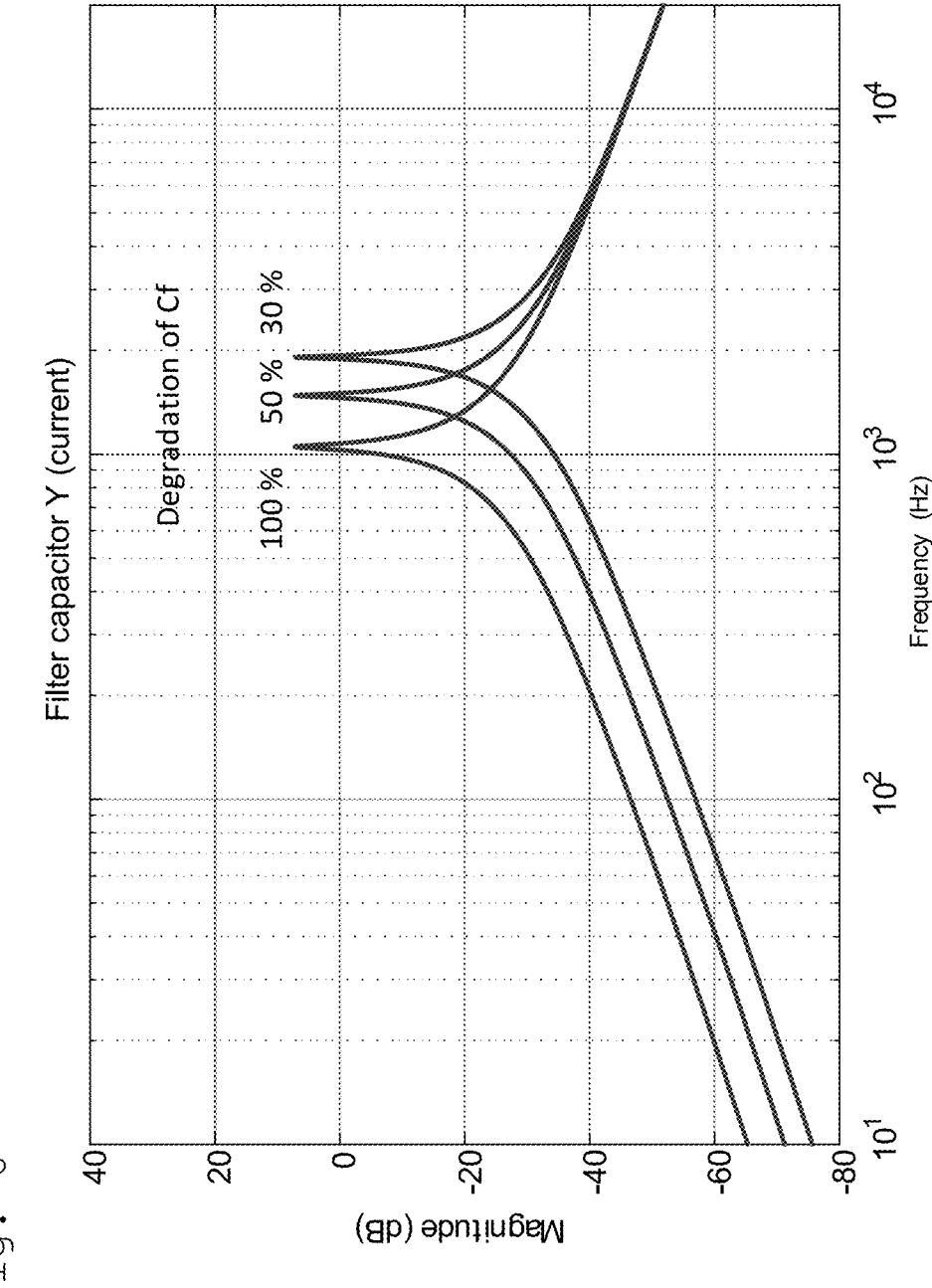
FIG. 6: a frequency domain signature of the capacitance change seen in the drive's output current.

The signature of the capacitance change is illustrated in the frequency domain in FIG. 6. Here, the capacitance is shown to drop from the initial 100% healthy value to 50% respective 30% of its initial value.

The signature of the capacitance change is illustrated in the frequency-domain in FIG. 7a for a drop of 20% in Cf capacitance. The same signature is detected in the time-domain by injecting a frequency sweep signal and detecting the highest magnitude of the current by a discrete Fourier transformation (DFT), in FIG. 7b. FIG. 7b shows a simulated demodulated signal and its resonance-frequency for both cases shown in FIG. 7a.

This present invention proposes to measure the resonance frequency of a healthy output power filter and repeat this over time to see if any change in its resonance frequency occurs. The degradation level of the capacitor can be calculated based on the following equations:

$$f_{resBaseline}=1/(2\pi\sqrt{(L_{ech}Cf_{Baseline})}),\qquad \text{Equation 1}$$

taken at Baseline time, assumed a healthy capacitor $$f_{resDegraded}=1/(2\pi\sqrt{(L_{ech}C_{fDegraded})}),\qquad \text{Equation 2}$$

taken at a later time, assumed a degraded capacitor

Equations 1 and 2 are theoretical representations. The mentioned frequencies can be determined from measurements.

The ratio of the two cases yields:

$$C_{fDegraded}=Cf_{Baseline}(f_{resBaseline}/f_{resDegraded})^2\qquad \text{Equation 3}$$

The percentual degradation of the Cf capacitance can be calculated as:

$$\text{Degradation}=100(f_{resBaseline}/f_{resDegraded})^{2}[\%]\qquad \text{Equation 4}$$

Therefore, the evaluation of the degradation may follow the following steps:

Injecting a controllable disturbance and measuring the resonance frequency of the system.

Detecting the resonance frequency of the healthy capacitor, from measurements

Detecting the resonance frequency of the degraded capacitor at a later time, from measurements.

Calculating the degradation level as per Eq. 4.

Figure 8:
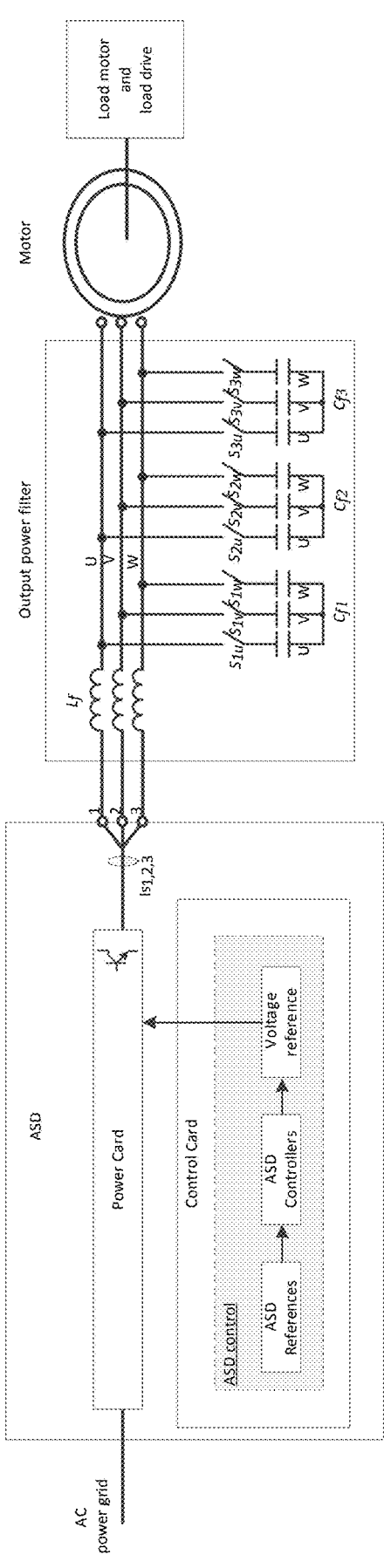
FIG. 8: a diagram of the laboratory setup used for testing the present invention.

Validation of the presently described method is done on the following setup, as shown in FIG. 8, by using an output power filter connected to an induction motor. The power filter is modified to allow gradual changes of the capacitance to lower values, which emulates the aging process of the capacitor. The change is done by switching the capacitors off, by using the switches S1uvw . . . . S3uvw individually for each phase. Thus, depending on the selection of the switches one can emulate a symmetrical or unbalanced degradation of the capacitors. This can be done with the motor in operation or at standstill.

The software of the ASD is modified to be able to measure the resonance of the power filter by adding an excitation and measuring the transfer function of the system.

Figures 9A, 9B, 9C:
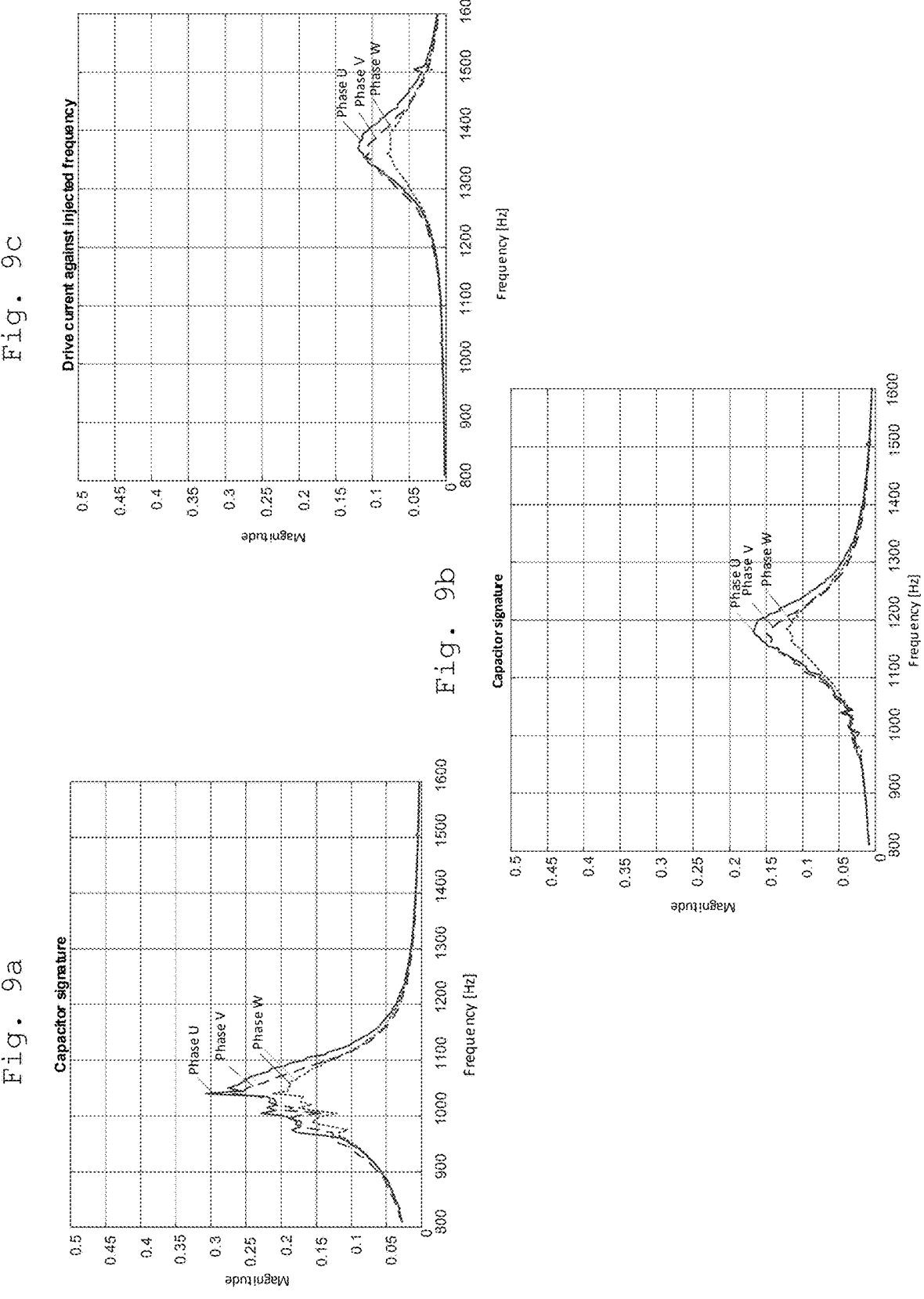
FIG. 9a-9c: resonance frequency recorded for a balanced changes of filter capacitors.

When measuring the change of the filter resonance frequency with the motor running or at standstill, the results shown in FIGS. 9a to 9c are obtained. FIGS. 9a to 9c show how the resonance frequency shifts to higher values when the capacitor degrades.

FIGS. 9a to 9c shows the resonance of the system for different degradation levels of the capacitors. In this example, the capacitor degradation is balanced, i.e. the same degradation occurs at all three phases. The amount of capacitor change is indicated in each figure. In the shown example, the motor speed is 700 RPM, with the ASD operating at the typical switching frequency of 5 kHz.

In FIG. 9a, the capacitors of each phase are at 100% of their initial capacitance. In FIG. 9b, the capacitors of each phase are at 80% of their initial capacitance and in FIG. 9c, the capacitors of each phase are at 60% of their initial capacitance.

Once the resonance frequency is measured, the degradation can be calculated from the capacitance according to Equation 4.

Figure 10:
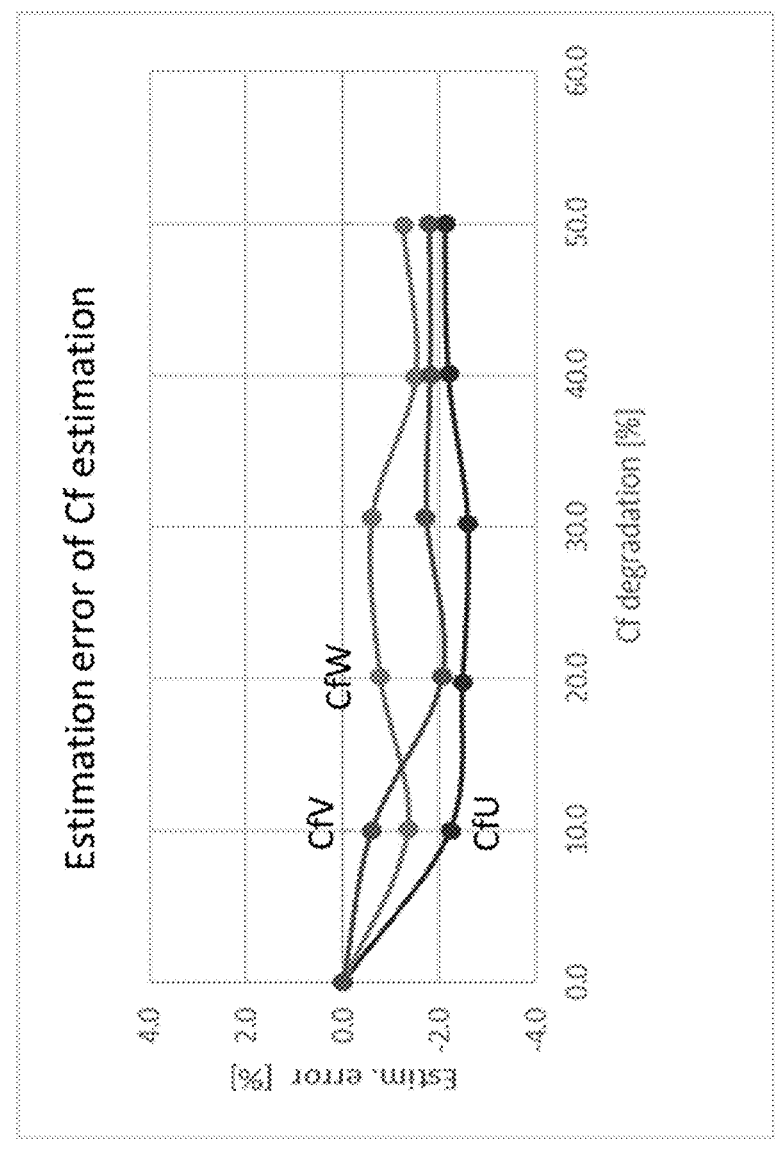
FIG. 10: the accuracy of the estimated degradation for balanced capacitor degradation.

The accuracy of the estimated degradation may be compared against measurements of capacitance done with calibrated instruments. An example of the difference is given in FIG. 10.

Figure 11:
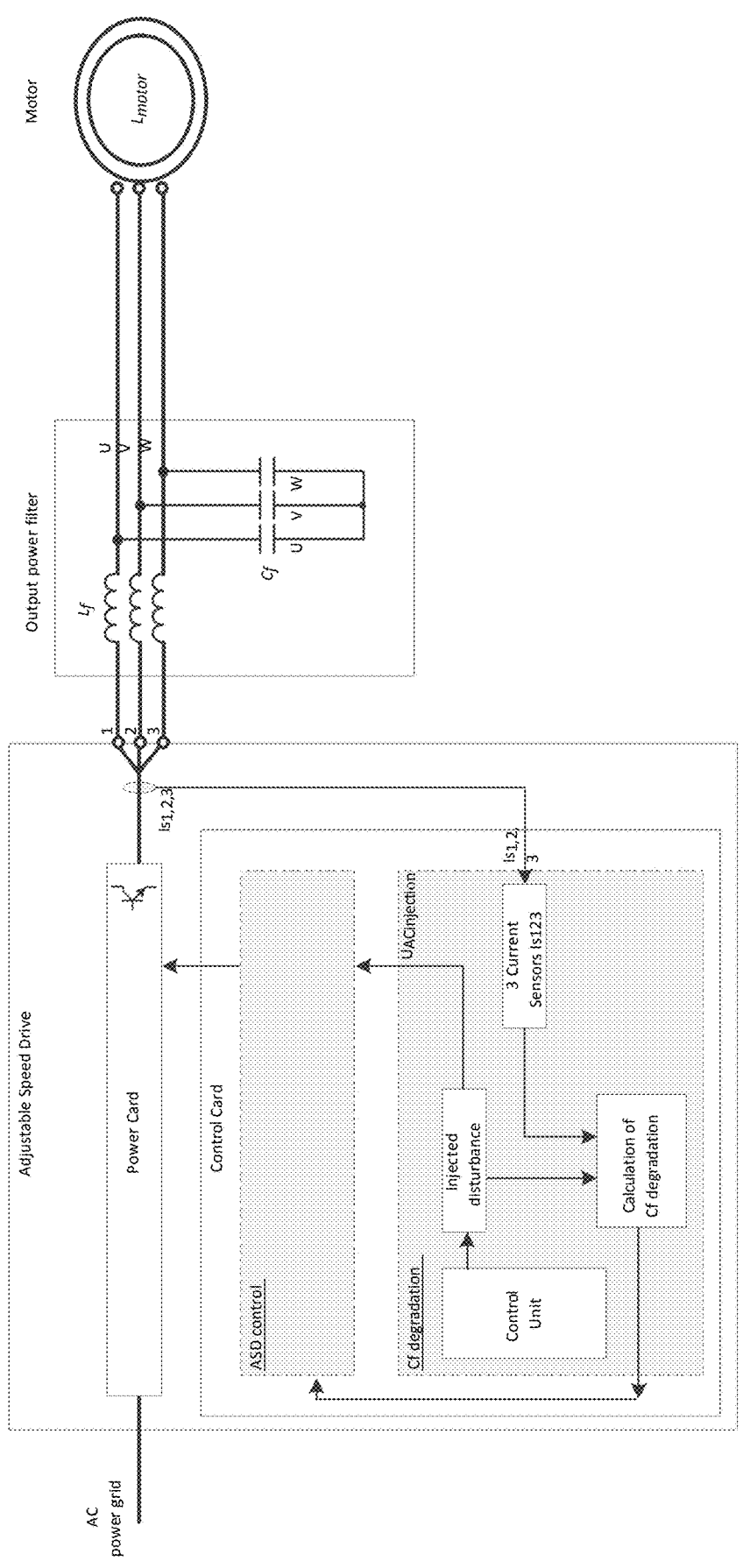
FIG. 11: a block diagram of the components used for calculation of the Cf degradation.

FIG. 11 shows a block diagram with the main components of the presently described invention. The components may be software functions implemented in an existing ASD. The present invention centres around the step named 'Cf degradation' in FIG. 11.

The block diagram shows the ASD connected to AC power grid and, via an output power filter, to a motor. The ASD comprises at least two components:

a. a power card, with all hardware, analogue, digital circuits, power switches, etc. and b. a control card, with all software, control, and protection of the ASD, etc.

The ASD control card primarily provides ASD control i.e. the primary function of the ASD. It provides the control of the hardware and all the needed features for motor control.

The ASD control also provides the secondary function of Cf degradation monitoring. A corresponding algorithm is implemented in the Control Card SW that receives internal and external signals and calculates the capacitor degradation in the power filter. This information is used later for warning and/or feed back into the 'ASD control' to improve the stability and control performance.

The subcomponents of the 'Cf degradation' portion are the following:

1. Control Unit—a function responsible for synchronizing (by signal 'sync') the entire process of injecting the AC current and measuring the effect produced in the ASD output currents and voltages. The injection process takes only a short period of time, but it is repeated periodically based on a local timer. This approach minimizes the ripple produced in the output motor torque and speed. This function also estimates when it is the right time to inject the AC current to not disturb the system and cause faults and trips. It also checks if the ASD is in steady and stable operation conditions to perform the measurement and avoid erroneous results. The magnitude of the AC injection is also set by this block for the same reason not to produce excessive disturbance.

2. Injection of AC voltage—a function that aggregates the information received from the Control Unit (magnitude, frequency range, enable flag) block into the needed reference $U_{ACinjection}$ and sends it to the ASD Controllers, to be added to the AC output. It starts the injection when receiving the synchronization signal from the Control Unit. This function synchronizes the injection to have the lowest possible disturbance of the normal operation of the ASD output current to avoid transients and erroneous results.

3. Current Sensors Is—a function that receives the output currents Is 1,2,3 from the ASD current sensors and after filtering for offset, noise, or common mode signals.

4. Calculation of Cf degradation—a function that implements the Equation 4 to determine how much the capacitor degraded since the last baseline value was recorded. This function can also implement regression curves with the collected time-series to determine the end-of-life of the capacitor. One output of this function is an estimated Cf value based on the calculated degradation, which can feed the ASD control for improving its control stability and performance.

Another output is for warnings and tripping logic, based on user choice. The timer value can vary based on ASD operating hours and availability for measuring, based on application specifics limits.

Figure 12:
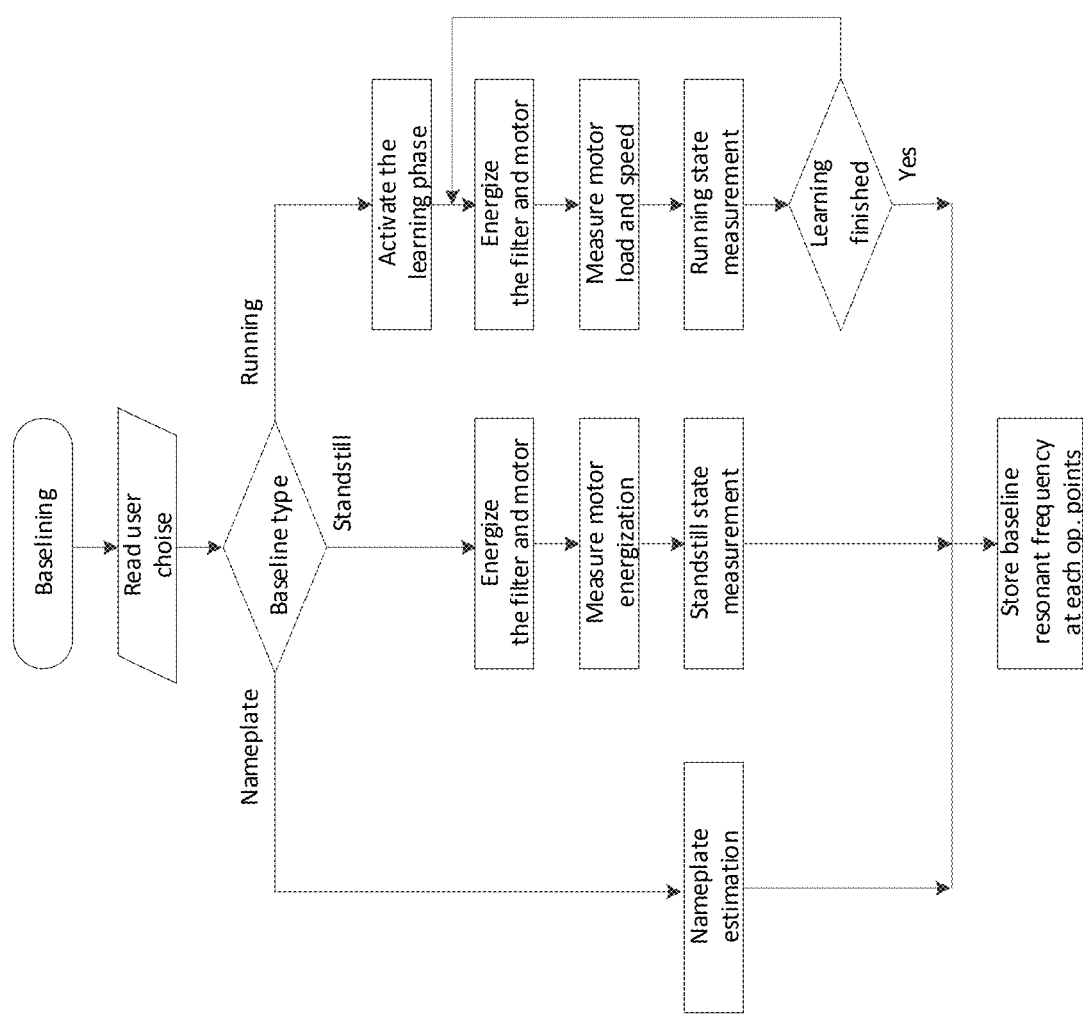
FIG. 12: a flow chart showing three ways of collecting the baseline resonant frequency.

FIG. 12 shows how the Baseline mode differentiates between different choices for measuring capacitor degradation.

The Nameplate estimation is used for those power filters already in use for a while, where the capacitors may have already degraded, therefore the initial capacitor value is not measurable.

The Standstill state is used for cases when it is not possible to perform or not desired by the user during the Running state. It could be executed for example at production stops The Running state requires less user intervention, but relies on a learning phase to collect data while the application is running.

Figure 13:
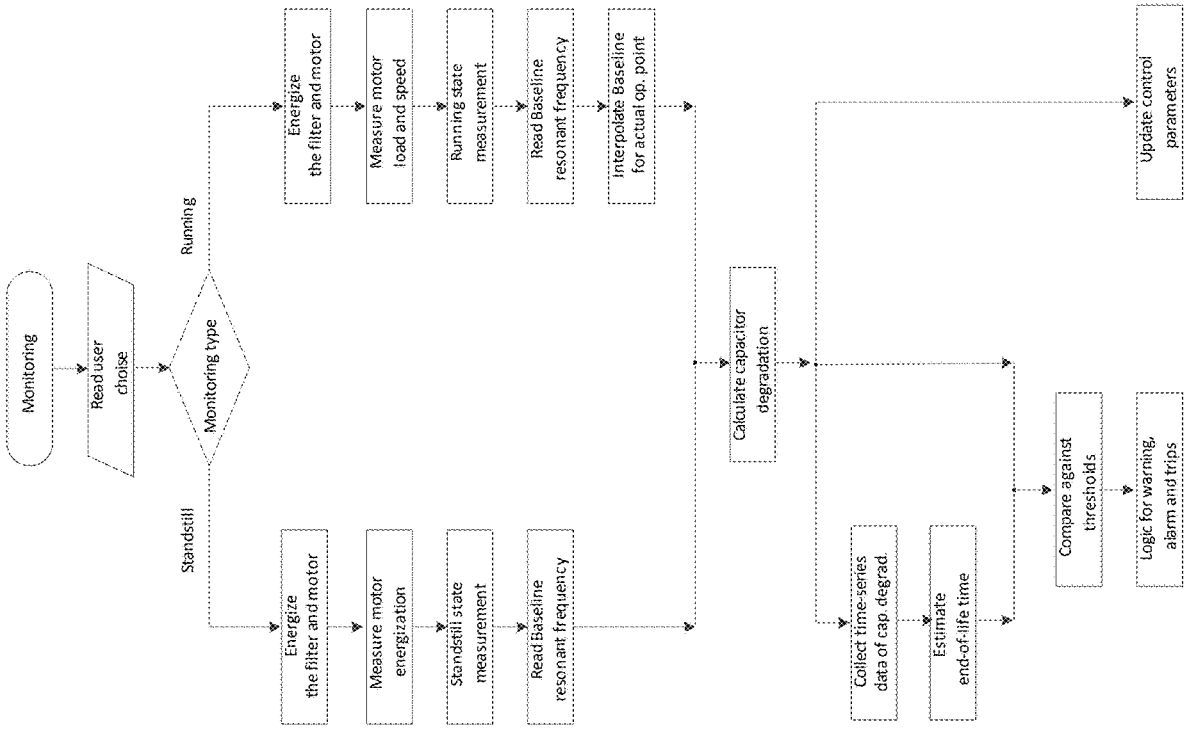
FIG. 13: a flow chart showing monitoring of the capacitor degradation.

FIG. 13 describes the Monitoring phase of the capacitor degradation. The monitoring may be performed at Standstill state or Running state, depending on user choice. In the case of Standstill state monitoring, the system is energized to the same levels used during the Baselining phase. This decouples the load dependence and ensures the same condition for evaluation of the resonant frequency and therefore the capacitance.

In the case of the Running state monitoring, the load and the speed of the motor are also measured and the result of the monitoring uses this information when comparing against the Baseline value. Interpolation is used when the exact loading value is missing from the Baseline dataset.

The output result may be used for different scopes, either to provide warnings, alarms, trips or to improve the control performance of the power converter.

While the present disclosure has been illustrated and described with respect to a particular embodiment thereof, it should be appreciated by those of ordinary skill in the art that various modifications to this disclosure may be made without departing from the spirit and scope of the present disclosure.

The invention claimed is:

1. A method for evaluating the degradation level of one or more capacitors (Cf) of a power filter connected to an adjustable speed drive (ASD) or a power converter, the method comprising:

injecting a degradation-determining controllable disturbance comprising an AC signal into the power filter or the adjustable speed drive (ASD) or the power converter;

measuring a response to determine a degraded resonance frequency ($f_{resDegraded}$) of the power filter; and calculating the degradation level of the one or more capacitors (Cf) based on a comparison of a baseline resonance frequency ($f_{resBaseline}$) of the power filter and the degraded resonance frequency ($f_{resDegraded}$);

wherein the degradation level of the capacitor (Cf) is determined from the equation:

$$\text{Degradation} = 100 \left( \frac{f_{resBaseline}}{f_{resDegraded}} \right)^2 [\%].$$

2. The method according to claim 1, wherein determining the baseline resonance frequency ($f_{resBaseline}$) of the power filter involves injecting a baseline-determining controllable disturbance prior to injecting the degradation-determining controllable disturbance and measuring the response of the power filter.

3. The method according to claim 1, wherein the method steps are repeated periodically based on a local timer value.

4. The method according to claim 3, wherein the timer value is a function of the operating time of the power converter or adjustable speed drive (ASD).

5. The method according to claim 1, wherein the determination of the baseline resonance frequency ($f_{resBaseline}$) of the power filter including the capacitor (Cf) comprises a nameplate estimation using data associated with the listed ratings of the power filter, a standstill state measurement with the adjustable speed drive (ASD) powered but the motor not in operation or a running state measurement with the motor in operation.

6. The method according to claim 1, wherein the degraded resonance frequency ($f_{resDegraded}$) of the power filter including the capacitor (Cf) comprises a standstill state measurement and/or a running state measurement.

7. The method according to claim 1, wherein the power filter comprises an input power filter and/or an output power filter.

8. The method according to claim 1, wherein software for operating the adjustable speed drive (ASD) or the power converter is provided for measuring the resonance of a system comprising the capacitor (Cf) by injecting the degradation-determining controllable disturbance and measuring the transfer function of the system comprising the capacitor (Cf).

9. The method according to claim 1, including at least one of following:

a frequency of injections is monotonically changed within a given range around the degraded or non-degraded resonance frequency ($f_{resDegraded}$, $f_{resBaseline}$), or a frequency of injection is randomized to minimize disturbances, or the injections omit critical frequency areas to avoid control issues, or the magnitudes of injections are adjusted to minimize disturbances, or the duration of injections are adjusted to minimize disturbances, or the method steps are repeated at an automatically increasing repetition rate, when the capacitor (Cf) degrades beyond a given level.

10. The method according to claim 1, including at least one of following:

the lengths and/or the magnitudes of the injections are adapted to the speed or load of the running conditions of the adjustable speed drive (ASD) or the power converter, or the method steps are repeated at a rate which is adjusted.

11. The method according to claim 1, including at least one of following:

the degradation level is compared to thresholds to issue warnings, alarms and/or trip signals, or the degradation level is determined for each phase of a multiphase signal individually, or a time-series of capacitor degradation is used to estimate the end-of-life moment for predictive/preventive maintenance, or capacitor degradation is used for updating the control parameters of the adjustable speed drive (ASD) or the power converter to improve the control performance, or the determined resonant frequencies ($f_{resDegraded}$, $f_{resBaseline}$) are used to omit operating conditions of the adjustable speed drive (ASD) or the power converter that may excite said resonant frequencies ($f_{resDegraded}$, $f_{resBaseline}$).

12. An adjustable speed drive (ASD) provided for performing the method according to claim 8, wherein its software is provided for measuring the resonance of the system comprising the capacitor (Cf) by injecting the degradation-determining controllable disturbance and measuring the transfer function of the system comprising the capacitor (Cf).

13. A power converter provided for performing the method according to claim 8, wherein its software is provided for measuring the resonance of the system comprising the capacitor (Cf) by injecting the degradation-determining controllable disturbance and measuring the transfer function of the system comprising the capacitor (Cf).

14. The method according to claim 2, wherein the method steps are repeated periodically based on a local timer value.

15. The method according to claim 2, wherein the determination of the baseline resonance frequency ($f_{resBaseline}$) of the power filter including the capacitor (Cf) comprises a nameplate estimation using data associated with the listed ratings of the power filter, a standstill state measurement with the adjustable speed drive (ASD) powered but the motor not in operation or a running state measurement with the motor in operation.

16. The method according to claim 3, wherein the determination of the baseline resonance frequency ($f_{resBaseline}$) of the power filter including the capacitor (Cf) comprises a nameplate estimation using data associated with the listed ratings of the power filter, a standstill state measurement with the adjustable speed drive (ASD) powered but the motor not in operation or a running state measurement with the motor in operation.

17. The method according to claim 4, wherein the determination of the baseline resonance frequency ($f_{resBaseline}$) of the power filter including the capacitor (Cf) comprises a nameplate estimation using data associated with the listed ratings of the power filter, a standstill state measurement with the adjustable speed drive (ASD) powered but the motor not in operation or a running state measurement with the motor in operation.

18. The method according to claim 3, wherein the degraded resonance frequency ($f_{resDegraded}$) of the power filter including the capacitor (Cf) comprises a standstill state measurement with the adjustable speed drive (ASD) powered but the motor not in operation or a running state measurement with the motor in operation.

19. The method according to claim 4, wherein the degraded resonance frequency ($f_{resDegraded}$) of the power filter including the capacitor (Cf) comprises a standstill state measurement with the adjustable speed drive (ASD) powered but the motor not in operation or a running state measurement with the motor in operation.

* * * * *